United States Patent [19]
Moon et al.

[11] Patent Number: 5,721,740
[45] Date of Patent: Feb. 24, 1998

[54] FLIP-FLOP CONTROLLER FOR SELECTIVELY DISABLING CLOCK SIGNAL

[75] Inventors: Kab-ju Moon; Seong-rae Cho, both of Kyungki-do; Hyuk-sang Kwon, Seoul, all of Rep. of Korea

[73] Assignee: Samsung Electronocs Co., Ltd., Kyungki, Rep. of Korea

[21] Appl. No.: 590,302

[22] Filed: Jan. 23, 1996

[30] Foreign Application Priority Data

Jan. 27, 1995 [KR] Rep. of Korea ................. 95-1573

[51] Int. Cl.[6] ............................... G01R 31/28
[52] U.S. Cl. ............................ 371/22.3; 364/556
[58] Field of Search .................. 371/22.3, 22.1, 371/22.6; 324/158 R; 365/201, 205; 364/555, 556

[56] References Cited

U.S. PATENT DOCUMENTS

| | | | |
|---|---|---|---|
| 4,463,440 | 7/1984 | Nishiura et al. | 364/900 |
| 5,117,443 | 5/1992 | Shires | 375/111 |
| 5,235,600 | 8/1993 | Edwards | 371/22.3 |
| 5,467,354 | 11/1995 | Yamauchi | 371/22.3 |
| 5,502,689 | 3/1996 | Peterson et al. | 368/156 |

*Primary Examiner*—Hoa T. Nguyen
*Attorney, Agent, or Firm*—Cushman Darby & Cushman IP Group of Pillsbury Madison & Sutro LLP

[57] ABSTRACT

A flip-flop controller including a clock controller for enabling or disabling a clock signal in response to a clock enabling signal and one or more flip-flops for selectively latching a function mode signal or scan test mode signal in response to a mode selection signal while being synchronous with the clock signal, is provided. As a result, a test vector is easily generated, fault coverage is increased to a desired degree using relatively few test vectors. Also, power consumption can be reduced by disabling the unnecessary portion of the clock signal applied to the flip-flop.

3 Claims, 8 Drawing Sheets

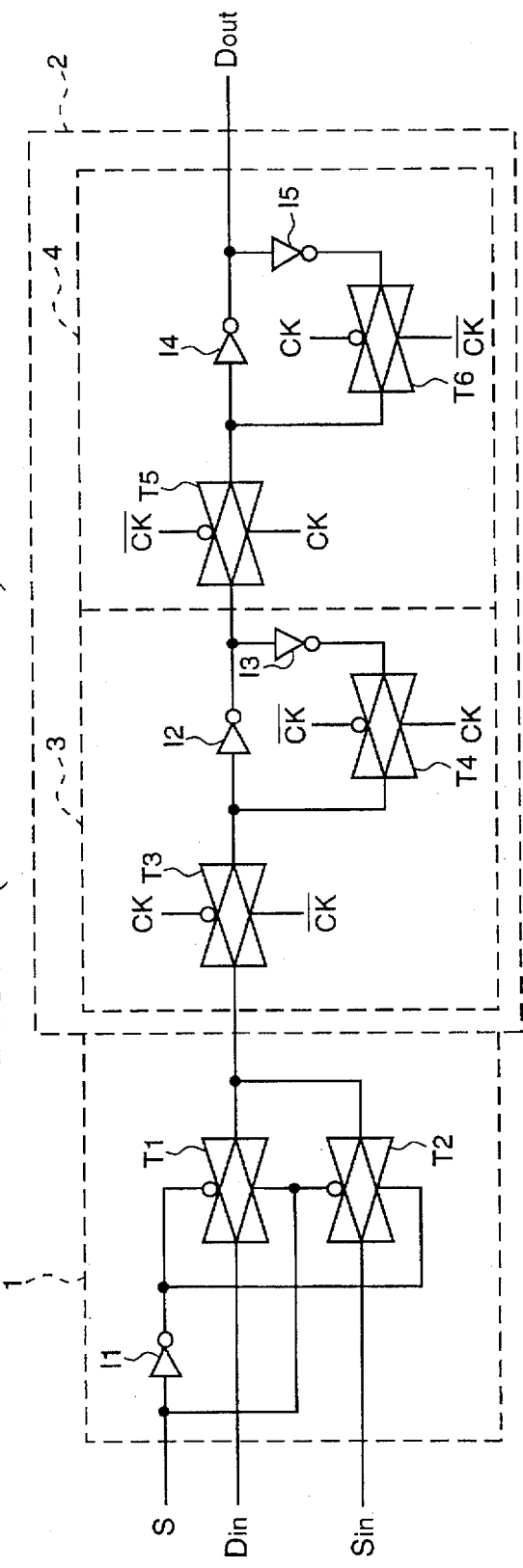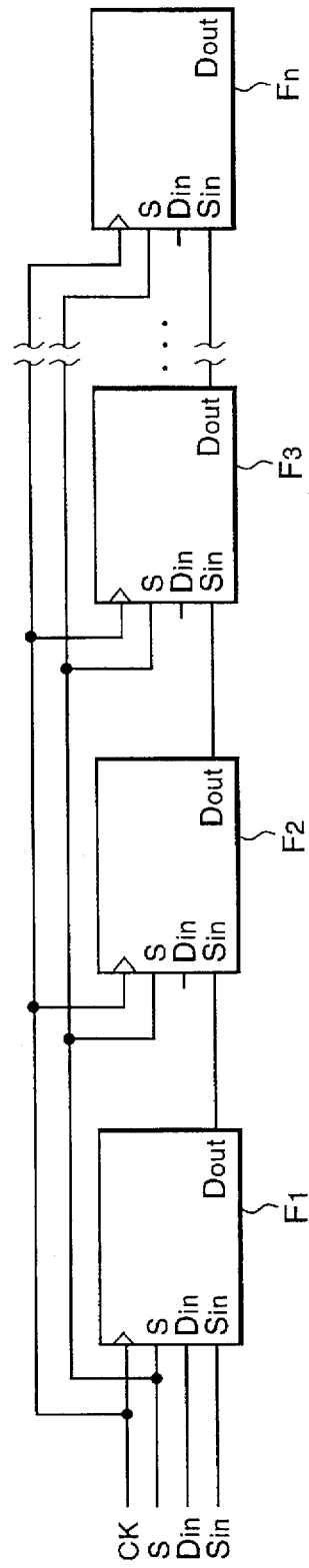
FIG. 1 (PRIOR ART)
FIG. 2 (PRIOR ART)

FLIP-FLOP CONTROLLER FOR SELECTIVELY DISABLING CLOCK SIGNAL

BACKGROUND OF THE INVENTION

The present invention relates to a flip-flop controller, and more particularly, to a flip-flop controller which easily generates a test vector and increases fault coverage.

Logic circuit test typically includes a function test and a fault test, and adequate fault coverage is achieved with the function test alone when testing ICs having relatively low integration levels. For highly integrated circuitry, however, fabrication errors cannot be properly detected with only the test vectors for the function test.

Meanwhile, since IC production costs rise in direct proportion to test time, the desired fault coverage should be attained using as few test vectors as possible. Hence, both full scan and partial scan methods have been recently used. In the full scan method wherein every device of an IC is fully tested, good fault coverage can be provided. However, since a circuit should be added to every storage element, the chip area should be increased. On the other hand, in the partial scan method wherein some devices are not tested, a circuit is added to a part of the storage elements so that the chip area can be reduced as compared with the full scan method, but good fault coverage cannot be provided. Here, the storage elements for the full or partial scan are generally designed to have two paths, that is, a functional data path and a scan data path.

FIG. 1 is a circuit diagram for illustrating a flip-flop having a conventional scan test function. Here, reference numeral 1 denotes an input selector, reference numeral 2 denotes a flip-flop, S denotes a control signal, $D_{in}$ denotes a data input signal, $S_{in}$ denotes an input signal for scan test, $D_{out}$ denotes a data output signal, and CK and $\overline{CK}$ denote a clock signal and an inverted clock signal, respectively.

Input selector 1 includes transmission gates T1 and T2 and inverter I1, and selects one of input signals $D_{in}$ and $S_{in}$ according to control signal S.

Flip-flop 2 is a general two phase static flip-flop of two stages and is comprised of master latch 3 and slave latch 4. Here, master latch 3 includes two transmission gates T3 and T4 and two inverters I2 and I3, and slave latch 4 includes two transmission gates T5 and T6 and two inverters I4 and I5.

The operation of the above-constituted flip-flop will be described below. When control signal S is high, input selector 1 selects the $D_{in}$ input. Conversely, when control signal S is low, input selector 1 selects the $S_{in}$ input. Here, flip-flop 2 outputs the data selected from input selector 1 to $D_{out}$, in synchronization with clock signal CK.

FIG. 2 is a diagram for illustrating a conventional full scan method. Here, a plurality of the flip-flops as shown in FIG. 1 are serially connected with each other.

Flip-flops $F_1 \sim F_n$ having the scan test function receive clock signal CK and control signal S, and $D_{out}$ of the flip-flop of the previous stage is input to $S_{in}$ of the next.

Since most of the input signals $D_{in}$ and $S_{in}$ of the flip-flop are merely connected via a buffer (not shown), clock signal CK is always enabled regardless of being in the function mode or scan test mode.

Also, it is difficult to control the clock signal applied to each flop-flop as well as independently with respect to the function mode or scan test mode.

SUMMARY OF THE INVENTION

It is an object of the present invention to provide a flip-flop controller which easily generates a test vector, increases fault coverage with fewer test vectors and reduces power consumption by disabling unnecessary portions of the clock signal.

To achieve the above object, there is provided a flip-flop controller comprising: a clock controller for generating a second clock signal by enabling or disabling a first clock signal in response to a clock enabling signal; and a plurality of flip-flops for selectively latching a function mode signal or a scan test mode signal in response to a mode selection signal while being synchronous with the second clock signal.

Here, the clock controller comprises: a first inverter for inverting a scan test mode setting signal; a second inverter for inverting a reset signal; a first logic gate for NAND-operating the outputs of the first and second inverters; a third inverter for outputting the mode selection signal by inverting the output of the first logic gate; a first transmission gate for transmitting a function mode clock enabling signal when the scan test mode setting signal is in the first logic state; a second transmission gate for transmitting a scan mode clock enabling signal when the scan test mode setting signal is in the second logic state; a third transmission gate for transmitting the outputs of the first and second transmitting gates when the first clock signal is in the third logic state; a fourth inverter for inverting the output of the third transmitting gate; a fifth inverter for inverting the output of the fourth inverter; a fourth transmission gate for transmitting the output of the fifth inverter to the fourth inverter when the clock signal is in the fourth logic state; a second logic gate for outputting the second clock signal by AND-operating the output of the fourth inverter and the first clock signal; a fifth transmission gate for transmitting the output signal of the second inverter when the scan test mode setting signal is in the fifth logic state; a sixth transmission gate for transmitting a scan test mode reset signal when the scan test mode setting signal is in the sixth logic state; and a sixth inverter for inverting the outputs of the fifth and sixth transmission gates.

Also, the flip-flops comprises: a seventh inverter for inverting the mode selection signal; a seventh transmission gate for transmitting the function mode signal when the output of the seventh inverter is the seventh logic state; a third logic gate for NOR-operating the scan test mode signal and scan test mode reset signal; an eighth transmission gate for transmitting the output of the third logic gate when the mode selection signal is in the eighth logic state; a ninth transmission gate for transmitting the outputs of the seventh and eighth transmission gates when the second clock signal is in the ninth logic state; an eighth inverter for inverting the output of the ninth transmission gate; a ninth inverter for inverting the output of the eighth inverter; a tenth transmission gate for transmitting the output signal of the ninth inverter when the second clock signal is in the tenth logic state; an eleventh transmission gate for transmitting the output of the eighth inverter when the second clock signal is in the ninth logic state; a tenth inverter for inverting the output of the eleventh transmission gate; an eleventh inverter for inverting the output of the tenth inverter when the second clock signal is in the tenth logic state; and a twelfth transmission gate for transmitting the output of the eleventh inverter to the tenth inverter when the second clock signal is in the ninth logic state.

BRIEF DESCRIPTION OF THE DRAWINGS

The above objects and advantages of the present invention will become more apparent by describing in detail preferred embodiments thereof with reference to the attached drawings in which:

FIG. 1 is a circuit diagram for illustrating a flip-flop having a conventional scan test function;

FIG. 2 is a diagram for illustrating a conventional full scan method;

DETAILED DESCRIPTION OF THE INVENTION

Figure 3:
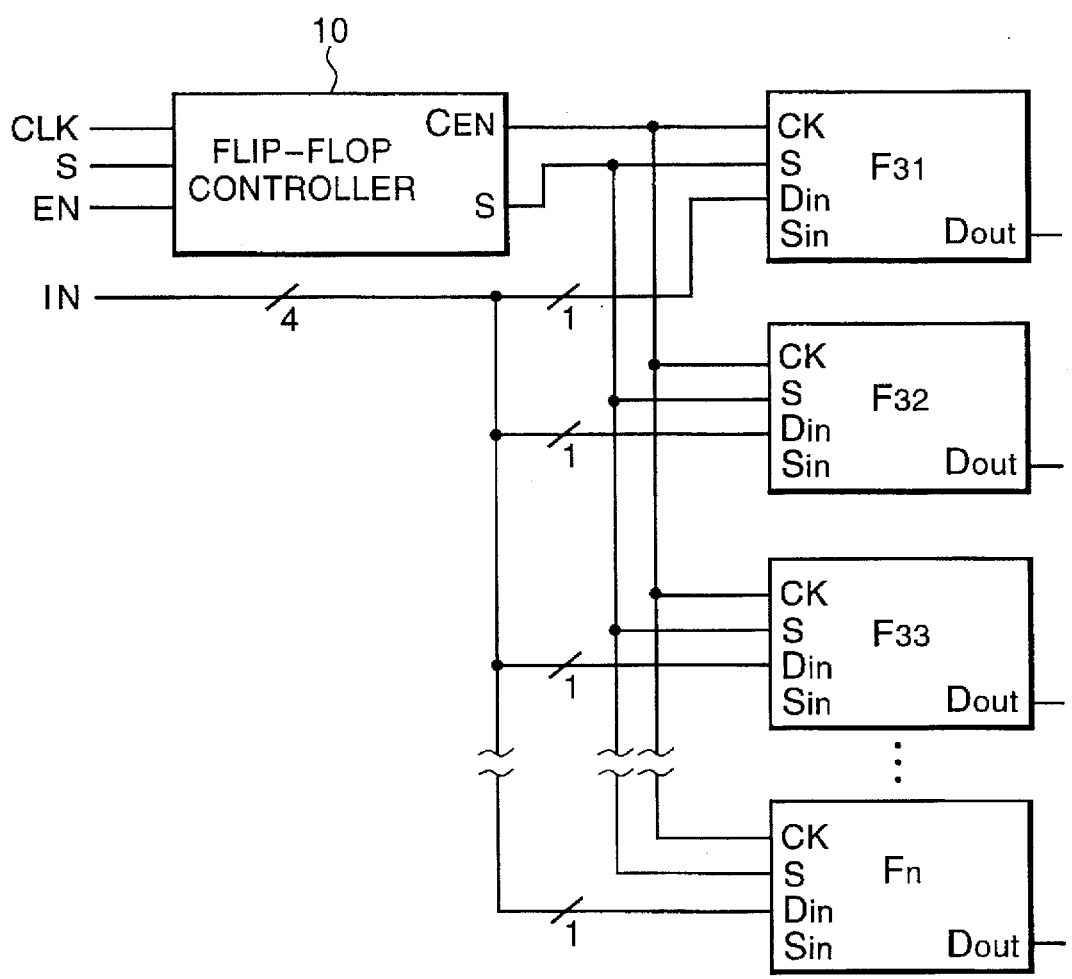
FIG. 3 is a schematic diagram for illustrating a structure of a flip-flop controller according to the present invention.

A flip-flop controller system shown in FIG. 3 includes flip-flop controller 10 and a plurality of flip-flops $F_{31}$, $F_{32}$, $F_{33}$, ..., $F_n$.

Figure 4:
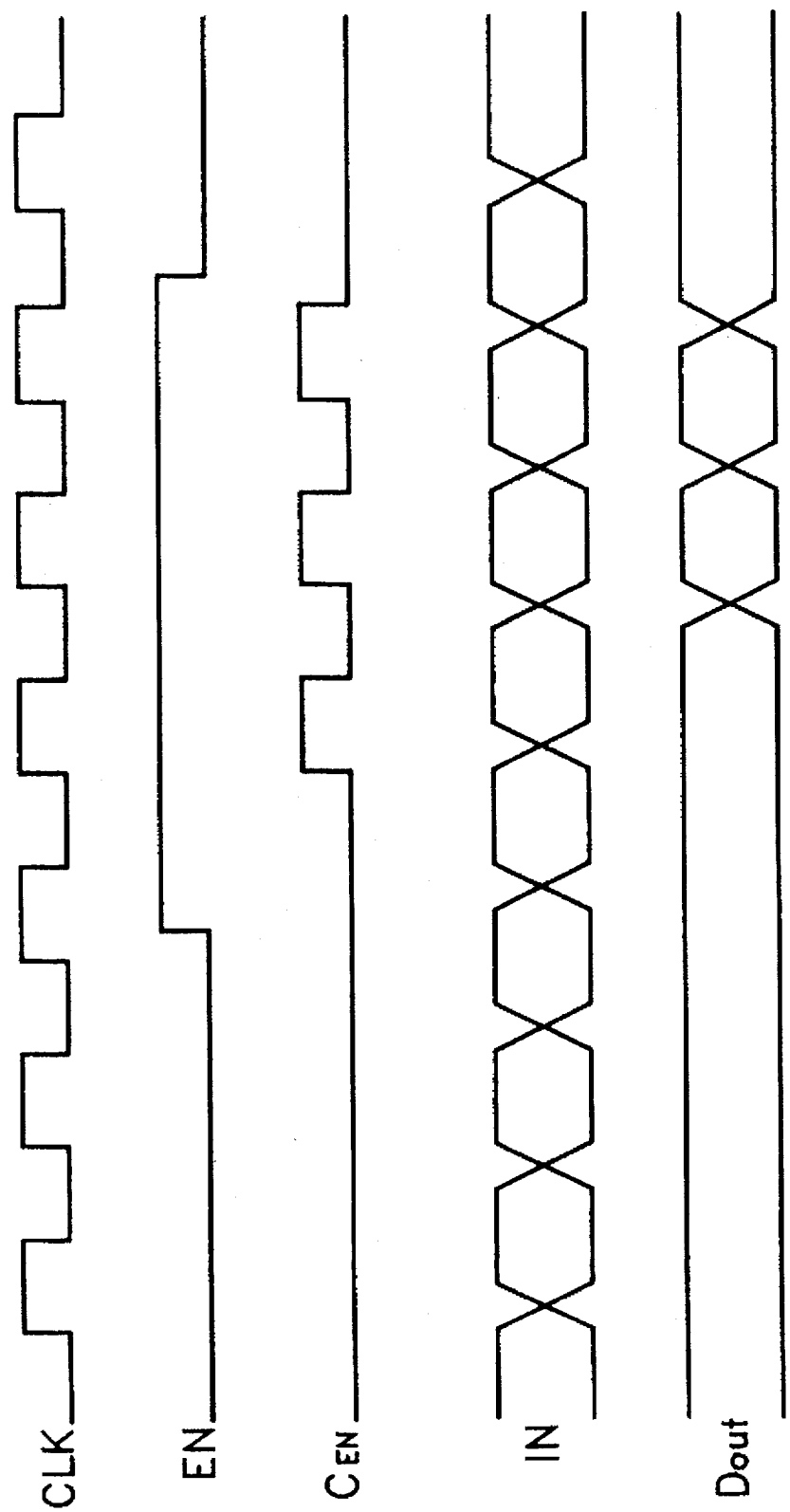
FIG. 4 shows an operational wave form for illustrating the operation of the flip-flop controller shown in FIG. 3.

In FIGS. 3 and 4, CLK denotes a system clock signal, S denotes a mode selection signal, EN denotes a clock enabling signal for determining whether the system clock signal is enabled, and IN denotes a data input signal.

First, flip-flop controller 10 outputs mode selection signal S after buffering. When clock enabling signal EN is high, flip-flop controller 10 enables system clock CLK and outputs it as a clock signal $C_{EN}$. Thus, data input signal IN is enabled when clock enabling signal EN is high.

Flip-flops $F_{31}$, $F_{32}$, $F_{34}$, ..., $F_n$ perform the function mode or scan mode according to mode selection signal S, in synchronization with clock signal $C_{EN}$. That is, $D_{in}$ is input during the function mode and $S_{in}$ is input during the scan mode.

Figure 5:
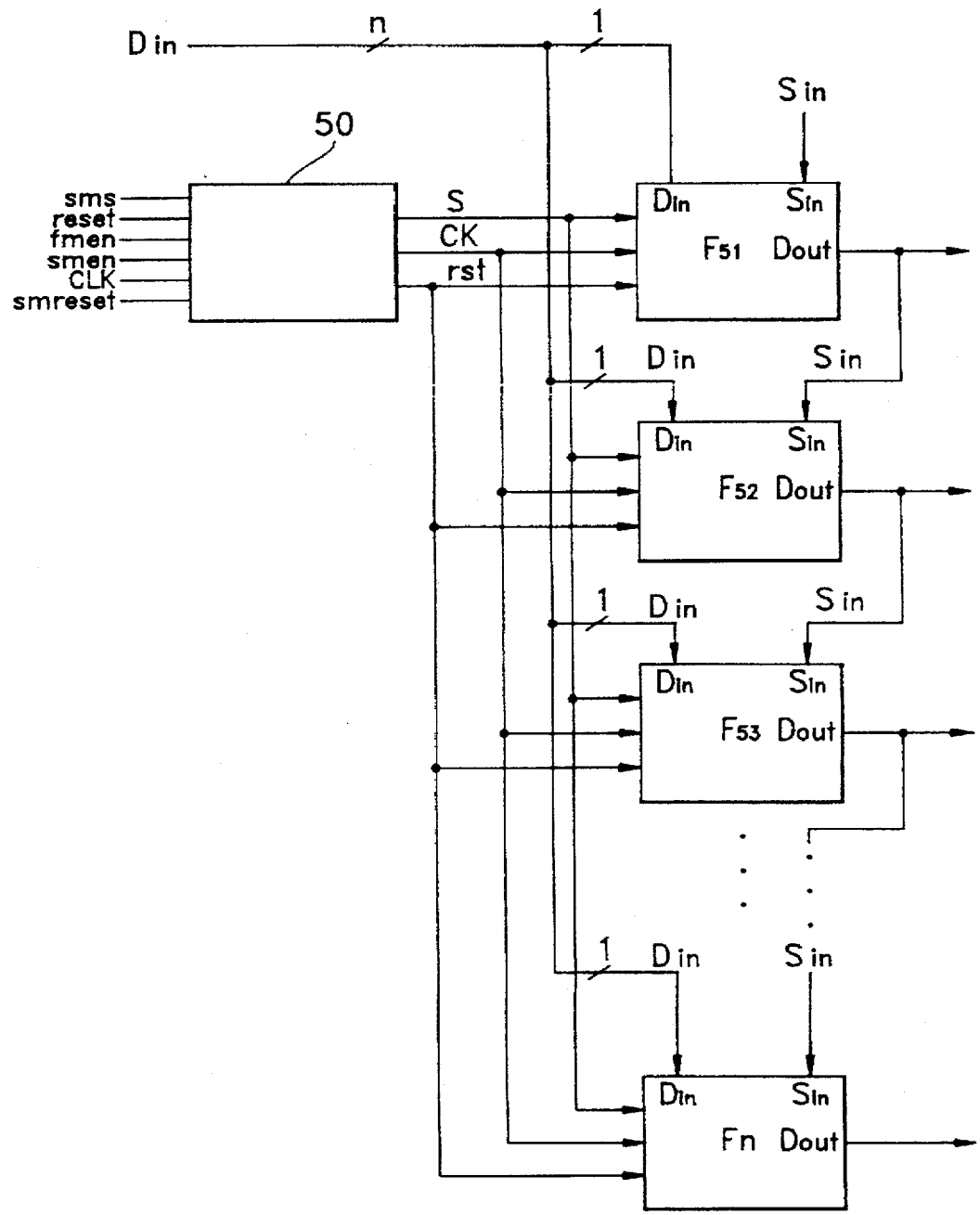
FIG. 5 is a block diagram for illustrating the flip-flop controller according to a preferred embodiment of the present invention.

The flip-flop controller system according to a preferred embodiment of the present invention shown in FIG. 5 comprises flip-flop controller 50 and a plurality of flip-flops $F_{51}$, $F_{52}$, $F_{53}$, ..., $F_n$. Here, "sms" denotes a scan mode setting signal, "reset" denotes a synchronous reset signal, "fmen" denotes a clock enabling signal of the function mode, CLK denotes a system clock, "smen" denotes a clock enabling signal of the scan mode, and "smreset" denotes a reset signal of the scan mode. Also, S represents a mode selection signal, CK represents a clock signal output from flip-flop controller 50 and "rst" represents a reset signal, respectively.

Figure 6:
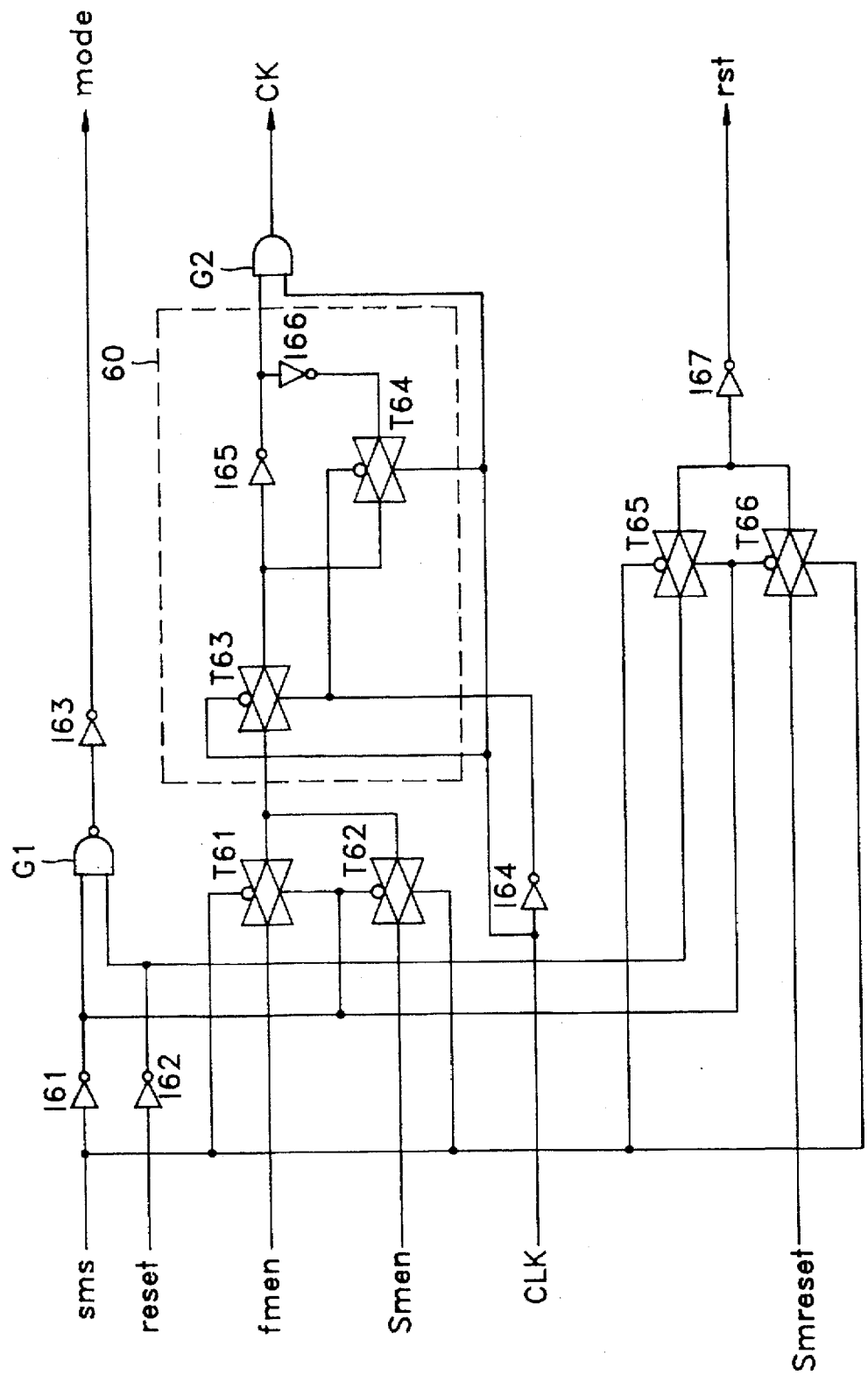
FIG. 6 is a detailed circuit diagram for illustrating the flip-flop controlling means 50 shown in FIG. 5.

FIG. 6 is a detailed circuit diagram for illustrating a flip-flop controller 50 such as that shown in FIG. 5.

Flip-flop controller 50 comprises inverters I61, I62, ..., I67, logic gates G1 and G2, and transmission gates T61, T62, ..., T66.

Specifically, gate G1 NAND-operates the sms signal inverted by inverter I61 and the reset signal inverted by inverter I62. Here, inverter I63 inverts the output signal of NAND gate G1 and outputs the inverted signal as the mode selection signal via a mode terminal.

Transmission gates T61, T62, ..., T66 perform a signal transmission according to two transmission control signals (positive input and negative input). That is, when the positive input is high and the negative input is low (or vice versa), signal transmission is performed. Transmission gate T61 transmits the fmen signal by receiving the sms signal at its negative input and the sms signal inverted by inverter I61 at its positive input. That is, the fmen signal is transmitted when the sms signal is low. Transmission gate T62 transmits the smen signal by receiving the sms signal at its positive input and the sms signal inverted by inverter I61 at its negative input. That is, the fmen or smen signal is selected according to the sms signal and then input to latch 60. Here, latch 60 is comprised of two transmission gates T63 and T64, and two inverters I65 and I66 and synchronized with CLK, as in the case of the circuit shown in FIG. 1. The signal latched by latch 60 and CLK are AND-operated via gate G2 and then supplied as the clock signal CK of flip-flops $F_{51}$, $F_{52}$, $F_{53}$, ..., $F_n$. Also, transmission gate T65 transmits the reset signal inverted by inverter I62 by receiving the sms signal at its negative input and the sms signal inverted by inverter I61 at its positive input. Transmission gate T66 transmits the smreset signal by receiving the sms signal at its positive input and the sms signal inverted by inverter I61 at its negative input. Here, inverter I67 inverts the output signal of transmission gates T65 and T66 and outputs the inverted signal as reset signal rst of flip-flops $F_{51}$, $F_{52}$, $F_{53}$, ..., $F_n$. Here, the fmen signal, smen signal and smreset signal are active low, and the sms and reset signals are active high.

Figure 7:
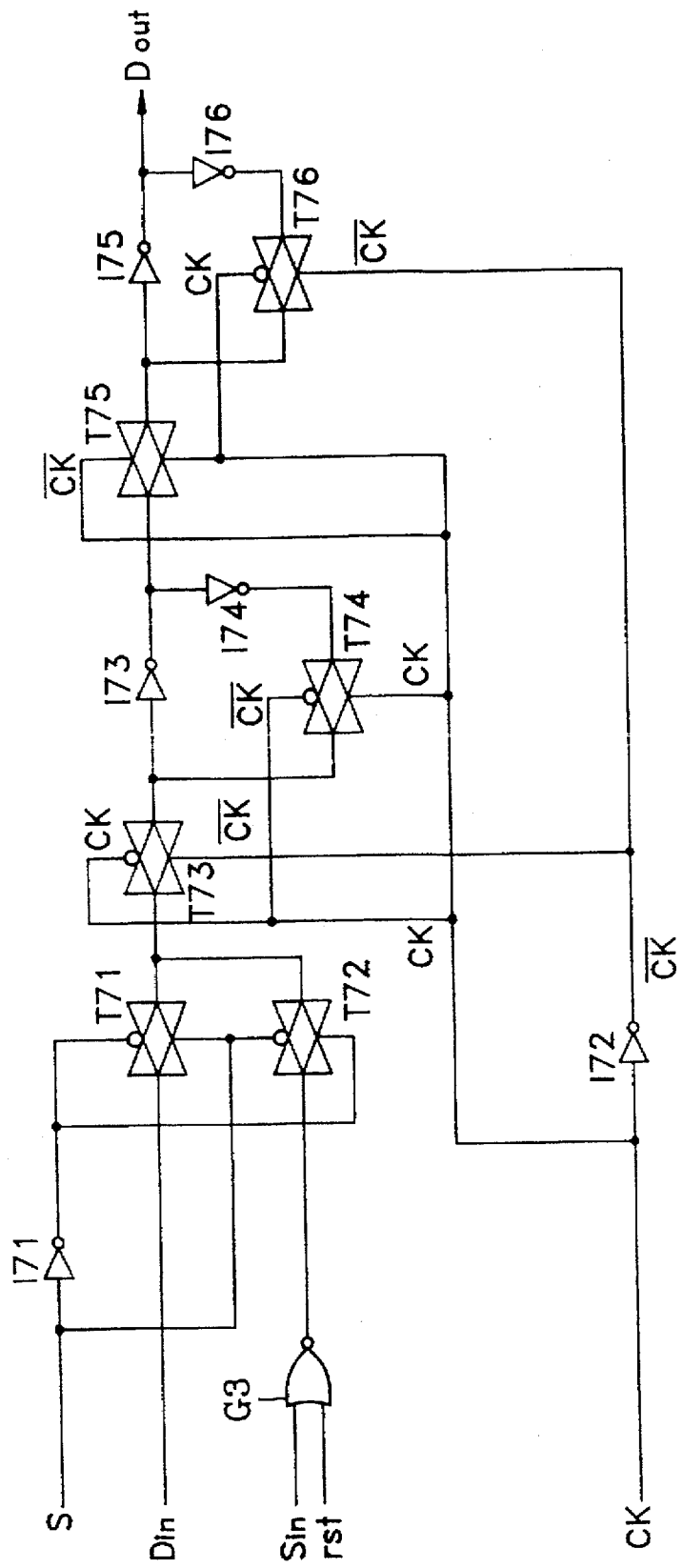
FIG. 7 is a detailed circuit diagram for illustrating one of a plurality of flip-flops shown in FIG. 5.

FIG. 7 is a detailed circuit diagram for illustrating one of the plurality of flip-flops $F_{51}$, $F_{52}$, $F_{53}$, ..., $F_n$ shown in FIG. 5. The circuit includes inverters I71, I72, I73, I74, I75 and I76, NOR gate G3 and transmission gates T71, T72, T73, T74, T75 and T76. The structure is the same as that of FIG. 1, except for gate G3 for NOR-operating the $S_{in}$ signal and the rst signal.

With reference to FIGS. 5 to 7, the overall operation will now be described.

First, in the operation of the function mode, when the sms and reset signals are low, mode selection signal S is high. Here, the fmen signal is irrelevant to the operation of the function mode.

When fmen is high, the CK signal is disabled. Thus, flip-flops $F_{51}$, $F_{52}$, $F_{53}$, ..., $F_n$ cannot latch the $D_{in}$ signal.

On the other hand, when fmen is low, the signal buffered from CLK signal becomes the CK signal. Thus, the $D_{in}$ signal is latched in the plurality of flip-flops $F_{51}$, $F_{52}$, $F_{53}$, ..., $F_n$. Here, when the reset signal having a high level and the fmen signal having a low level are applied, the rst signal is high. When the rst signal is high, the $S_{in}$ signal becomes disabled.

Next, in the operation of the scan mode, when the sms and smreset signals are both high and the reset and smen signals are both low, the scan mode is operated. When sms is high, mode selection signal S is low, and transmission gate T62 passes the smen signal. Subsequently, the smen signal inverted by inverter I65 and the CLK signal are AND-operated by AND gate G2 and then output as a CK signal. When sms is high, mode selection signal S is low. Accordingly, the scan mode is operated and the $S_{in}$ signal is enabled. Here, when the smreset signal is low, the rst signal goes high via transmission gate T66. Thus, the output of gate G3 is low regardless of the $S_{in}$ signal. As a result, the scan mode operation is reset.

Figure 8:
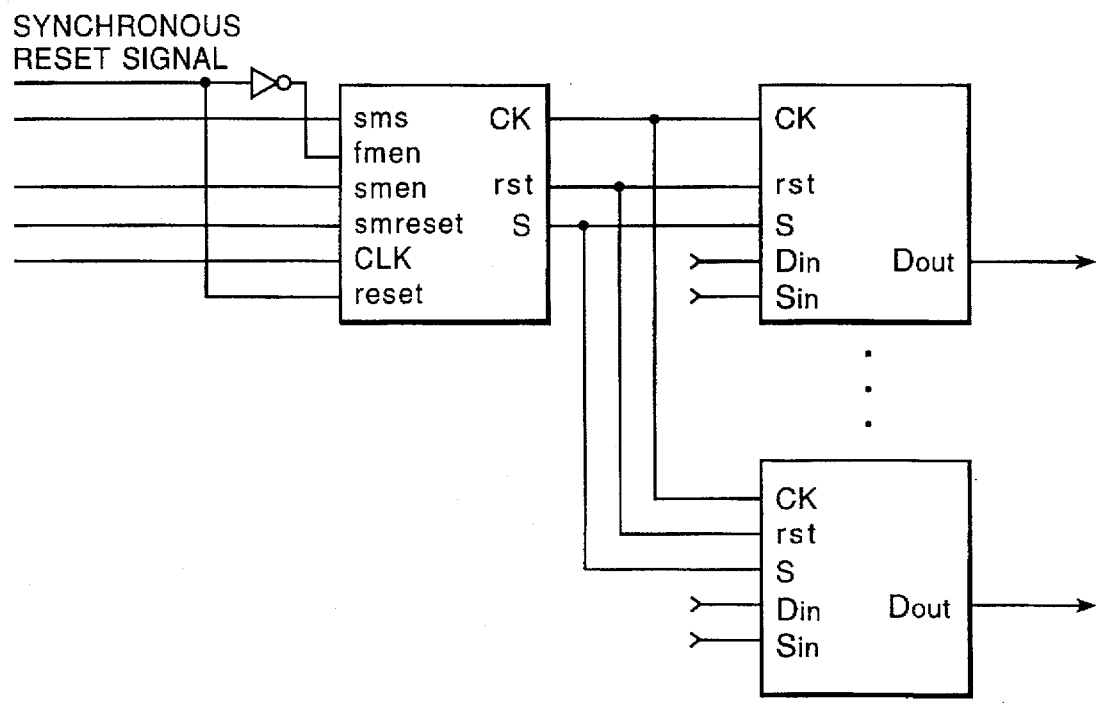
FIG. 8 is a diagram for illustrating the flip-flop controller having a synchronous reset function according to another preferred embodiment of the present invention.

FIG. 8 is a diagram for illustrating the flip-flop controller having a synchronous reset function according to another preferred embodiment of the present invention. The synchronous reset signal is applied to the reset terminal of flop-flop controller 50 of FIG. 5. Also, the inverted synchronous reset signal is applied to a fmen signal terminal.

Figure 9:
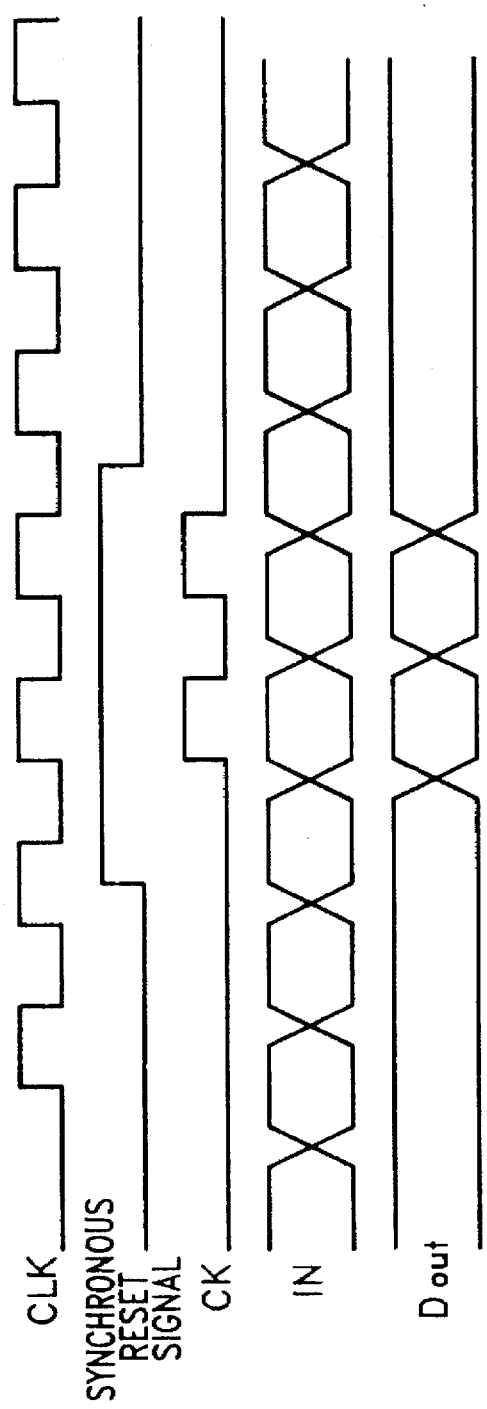
FIG. 9 shows an operational wave form for illustrating the operation of the flip-flop controller shown in FIG. 8.

FIG. 9 shows an operational wave form for illustrating the operation of the flip-flop controller shown in FIG. 8.

Figure 10:
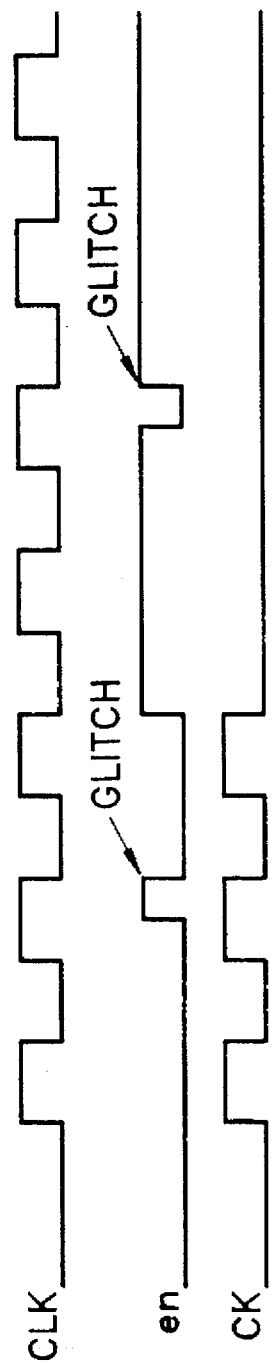
FIG. 10 shows an operational wave form when a glitch occurs in the fmen signal of FIG. 5.

FIG. 10 shows an operational wave form when a glitch occurs in the fmen signal. Here, even if the fmen signal includes the glitch, malfunction can be prevented by the latch including transmission gates T63 and T64, inverters I64 and I65, and logic gate G2.

As described above, according to the present invention, a circuit for controlling a clock signal and a control signal related with a test is added to the front end of a flip-flop, to thereby increase fault coverage with relatively few test vectors, easily generate a test vector. Also, power consumption can be reduced by disabling the unnecessary portion of the clock signal applied to the flip-flop.

What is claimed is:

1. A flip-flop controller comprising:
   a clock controller for generating a second clock signal by enabling or disabling a first clock signal in response to a clock enabling signal, said clock controller including:
   a first inverter for inverting a scan test mode setting signal;
   a second inverter for inverting a reset signal;
   a first logic gate for NAND-operating the outputs of said first and second inverters;
   a third inverter for outputting a mode selection signal by inverting the output of said first logic gate;
   a first transmission gate for transmitting a function mode clock enabling signal when said scan test mode setting signal is in the first logic state;
   a second transmission gate for transmitting a scan mode clock enabling signal when said scan test mode setting signal is in the second logic state;
   a third transmission gate for transmitting the outputs of said first and second transmitting gates when said first clock signal is in the third logic state;
   a fourth inverter for inverting the output of said third transmitting gate;
   a fifth inverter for inverting the output of said fourth inverter;
   a fourth transmission gate for transmitting the output of said fifth inverter to said fourth inverter when said first clock signal is in the fourth logic state;
   a fifth transmission gate for transmitting the output signal of said second inverter when said scan test mode setting signal is in the fifth logic state;
   a sixth transmission gate for transmitting a scan test mode reset signal when said scan test mode setting signal is in the sixth logic state; and
   a sixth inverter for inverting the outputs of said fifth and sixth transmission gates; and
   a plurality of flip-flops which are all connected to receive said second clock signal simultaneously from said clock controller and which are adapted to selectively latch one of a function mode signal or a scan test mode signal in response to said mode selection signal, each of said plurality of flip-flops selectively latching said one signal synchronously with said second clock signal.

2. A flip-flop controller as claimed in claim 1, wherein each flip-flop of said plurality of flip-flops comprises:
   a seventh inverter for inverting said mode selection signal;
   a seventh transmission gate for transmitting said function mode signal when the output of said seventh inverter is the seventh logic state;
   a third logic gate for NOR-operating said scan test mode signal and scan test mode reset signal;
   an eighth transmission gate for transmitting the output of said third logic gate when the mode selection signal is in the eighth logic state;
   a ninth transmission gate for transmitting the outputs of said seventh and eighth transmission gates when said second clock signal is in the ninth logic state;
   an eighth inverter for inverting the output of said ninth transmission gate;
   a ninth inverter for inverting the output of said eighth inverter;
   a tenth transmission gate for transmitting the output signal of said ninth inverter when said second clock signal is in the tenth logic state;
   an eleventh transmission gate for transmitting the output of said eighth inverter when said second clock signal is in the ninth logic state;
   a tenth inverter for inverting the output of said eleventh transmission gate;
   an eleventh inverter for inverting the output of said tenth inverter when said second clock signal is in the tenth logic state; and
   a twelfth transmission gate for transmitting the output of said eleventh inverter to said tenth inverter when said second clock signal is in the ninth logic state.

3. A flip-flop controller as claimed in claim 1, wherein said clock controller disables unnecessary portions of said first clock signal in response to said clock enable signal such that power consumption of said plurality of flip-flops is reduced during a function mode and a scan test mode.

* * * * *